United States Patent
Ito et al.

(10) Patent No.: US 6,437,593 B1
(45) Date of Patent: Aug. 20, 2002

(54) ELECTRIC DEVICE TESTING APPARATUS AND ELECTRIC DEVICE TESTING METHOD

(75) Inventors: Akihiko Ito; Yoshihito Kobayashi, both of Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/500,486

(22) Filed: Feb. 9, 2000

(30) Foreign Application Priority Data

Feb. 22, 1999 (JP) .......................................... 11-042567

(51) Int. Cl.⁷ .............................................. G01R 31/26
(52) U.S. Cl. ...................................................... 324/765
(58) Field of Search ............................... 324/754, 755, 324/757, 758, 765; 340/870.17

(56) References Cited

U.S. PATENT DOCUMENTS 4,388,692 A * 6/1983 Jones et al. .................. 364/557
6,140,828 A * 10/2000 Iino et al. .................... 324/758

FOREIGN PATENT DOCUMENTS

JP 10142289 5/1998

OTHER PUBLICATIONS

Malinoski et al., "A Test Site Thermal Control System for At–Speed Manufacturing Testing." (Date Unavailable).

* cited by examiner

Primary Examiner—Michael J. Sherry
Assistant Examiner—Russell M. Kobert
(74) Attorney, Agent, or Firm—Birch, Stewart, Kolasch & Birch, LLP

(57) ABSTRACT

An electric device testing apparatus for carrying out a test by pushing a terminal of an IC against a contact portion of a test head, comprising a temperature calculation means for calculating an actual temperature of the IC based on a signal from a temperature sensing element provided on the IC.

3 Claims, 4 Drawing Sheets

ELECTRIC DEVICE TESTING APPARATUS AND ELECTRIC DEVICE TESTING METHOD

BACKGROUND OF THE INVENTION

1. Field of the Invention

The present invention relates to an electric device testing apparatus for testing an electric device, such as a semiconductor integrated circuit element (hereinafter, referred to representatively as an IC chip), and the method, more specifically relates to an electric device testing apparatus which can perform a test at a correct temperature considering heating of the electric device itself during the test and the method.

2. Description of the Related Art

A testing apparatus for testing a finally produced device, such as an IC chip, is necessary in a producing process of a semiconductor device, etc. As one kind of such testing apparatuses, an apparatus for testing an IC chip under applying a thermal stress of a normal temperature, a higher temperature and a lower temperature than a normal temperature is known. It is because IC chips are required to guarantee as a feature thereof to operate well under a normal, high and low temperature.

A test is carried out in such an electric device testing apparatus, wherein an upper portion of its test head is covered with a chamber for providing a sealed space, an IC chip is conveyed to above the test head under a constant temperature environment of a normal, high or low temperature, where the IC chip is pushed against the test head for electric connection. The IC chips are preferably tested by the above test and sorted into at least good ones and defective ones.

Along with the recent IC chips becoming higher speed and more highly integrated, however, there is a tendency that the heat generation by itself during operating has become higher and heat generated by itself tends to become higher also during the IC chip testing. For example, some generates about as much as 30 watts of heat by itself depending on kinds of the IC chips.

Accordingly, when a high temperature test of about 125° C. is carried out, for example, the quantity of heat by the self-heating in addition to that of the set temperature is applied to the IC chip, as a result, there arises a possibility that the temperature on the IC chip exceeds its tolerable limit. Also in a normal or low temperature test, even if inside the chamber is made to be at a constant temperature, it becomes difficult to carry out a test under a desired testing temperature due to a quantity of heat generated by the self-heating of the IC chip.

Although it has been studied to provide a sensor for detecting a temperature of the IC chip close to the IC chip and to feed back the actual temperature of the IC chip detected by the sensor to a temperature applying device, there is a limit to provide the temperature sensor closer to the IC chip and the heat resistance between the IC chip and the temperature sensor cannot be made to be zero. Therefore, the true temperature of the IC chip cannot be detected as long as using an externally provided sensor.

SUMMARY OF THE INVENTION

An object of the present invention is to provide an electric device testing apparatus which can carry out a test under a correct temperature by considering self-heating of the electric device during the test and the method.

(1) To attain the above object, according to a first aspect of the present invention, there is provided an electric device testing apparatus for carrying out a test by pushing a terminal of an electric device to be tested against a contact portion of a test head, comprising a temperature calculation means for calculating an actual temperature of the electric device to be tested based on a signal from a temperature sensing element provided to the electric device to be tested.

Also, according to the first aspect of the present invention, there is provided an electric device testing method for carrying out a test by pushing a terminal of an electric device to be tested against a contact portion of a test head, including the steps of detecting an actual temperature of the electric device to be tested based on a signal from a temperature sensing element installed in the electric device to be tested; and performing feed-back control at the detected temperature.

In the electric device testing apparatus and the method according to the first aspect, since an actual temperature is calculated based on a signal from a temperature sensing element provided on an electric device to be tested, a true temperature of the electric device to be tested can be detected without being affected by noise of heat resistance, etc. as a result, a test can be carried out at a correct temperature to be aimed and the reliability of the test results improves.

As a temperature sensing element according to the present invention is not specifically limited, however, when using diode having rectifying characteristics, the relationship of an output value with respect to the temperature becomes interrelated so the actual temperature can be easily calculated. Such a temperature sensing element can be produced exclusively for an electric device to be tested, but when applying an element produced as an electric device, it is possible to prevent increase of the costs for producing the electric device.

The actual temperature of an electric device to be tested calculated by a temperature calculation means is sent to an applying temperature control means for controlling a temperature to be applied to the electric device to be tested, a temperature applying means is controlled by a control signal from the applying temperature control means, and the temperature to be applied to the electric device to be tested is set to be an appropriate value.

In the above invention, places of the temperature calculation means and the applying temperature control means are not specifically limited, and they can be provided on a handler for handling the electric device to be tested and on a tester for sending a test signal to a contact portion to carry out a test of the electric devices to be tested. Also, the temperature calculation means and the applying temperature control means can be configured as separate devices.

(2) To attain the above object, according to the second aspect of the present invention, there is provided an electric device testing apparatus for carrying out a test by pushing a terminal of an electric device to be tested against a contact portion of a test head, comprising a temperature storing means for storing data about an actual temperature of the electric device to be tested under the test conditions obtained in advance; and an applying temperature sending means for sending data relating to the actual temperature of the electric device to be tested stored in the temperature storing means at the time of sending the test signal.

Further, according to the second aspect, there is provided an electric device testing method for carrying out a test by pushing a terminal of an electric device to be tested against the contact portion of the test head, including the steps of obtaining in advance data relating to an actual temperature of the electric device to be tested under the test conditions; and performing feed-forward control by the data relating to the actual temperature.

In the electric device testing apparatus and the method according to the second aspect, data relating to an actual temperature of an electric device to be tested under respective test conditions is obtained in advance and is sent in accordance with a test flow. Therefore, when obtaining a true temperature of the electric device to be tested or data relating to that without noise, such as heat resistance, a test can be carried out at an aimed correct temperature and the reliability of the test results improves.

Additionally, according to the present invention, since a so called feed-forward control becomes possible, when a desired temperature is sent in advance, it is possible to shorten the time to reach the desired temperature after conveying the electric device to be tested.

Note that the data relating to the actual temperature of the electric device to be tested from an applying temperature sending means is sent to the applying temperature control means, the temperature applying means is controlled by a control signal from the applying temperature control means, and the temperature to be applied to the electric device to be tested is set to an appropriate value.

The above data relating to the actual temperature in the invention includes a temperature control pattern, etc. in addition to data of an actual temperature.

In the above invention, places of the temperature storing means and the applying temperature sending means to be provided are not specifically limited, and they can be provided on a handler for handling an electric device to be tested, and on a tester for sending a test signal to a contact portion to carry out a test of the electric device to be tested. Also, the temperature storing means and the applying temperature sending means can be configured as separate devices.

Especially, when providing the temperature storing means and the applying temperature sending means on the tester, it is preferable to be integrated in an operation instruction program from the tester to the handler for handling the electric device to be tested. By doing so, operation instruction processing becomes remarkably easy and correct, further, it can be made only by changing or adding to the software without newly providing, changing or modifying a hardware.

(3) In the above invention, the specific configuration is not specifically limited as to the temperature applying means for applying a temperature to make an electric device to be tested become a predetermined temperature, and it may be any configurations. Also, the temperature to be applied includes all temperatures of high, normal and low.

An electric device to be tested applied in the present invention is not specifically limited and all kinds of electric devices are included, but the efficiency becomes especially remarkable when applying an IC having a large quantity of self-heating during operation.

BRIEF DESCRIPTION OF THE DRAWINGS

These and other objects and features of the present invention will be explained in more detail below with reference to the attached drawings, wherein.

DESCRIPTION OF THE PREFERRED EMBODIMENTS

First Embodiment

Figure 1:
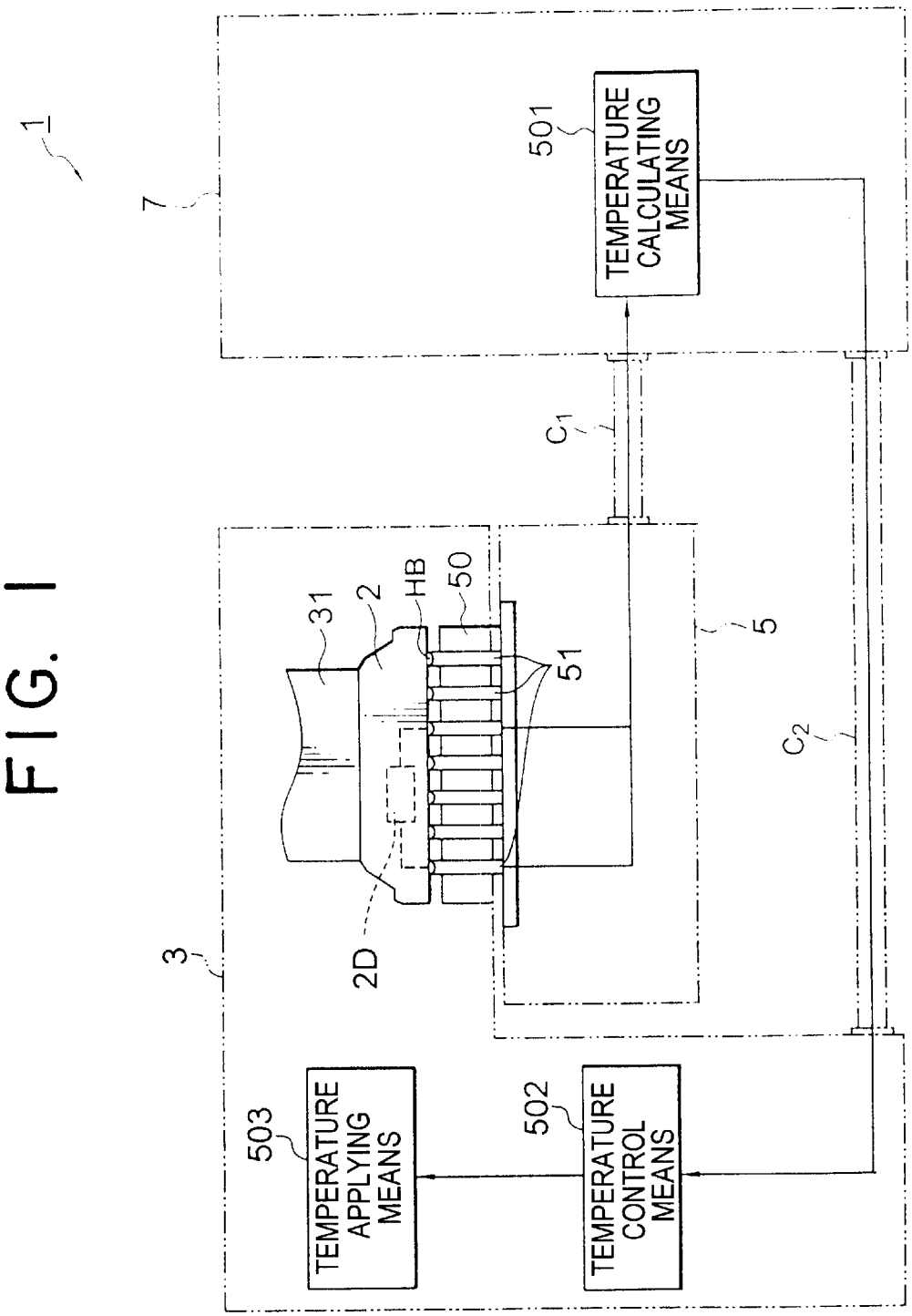
FIG. 1 is a block diagram of a first embodiment of an electric device testing apparatus of the present invention.
Figure 2:
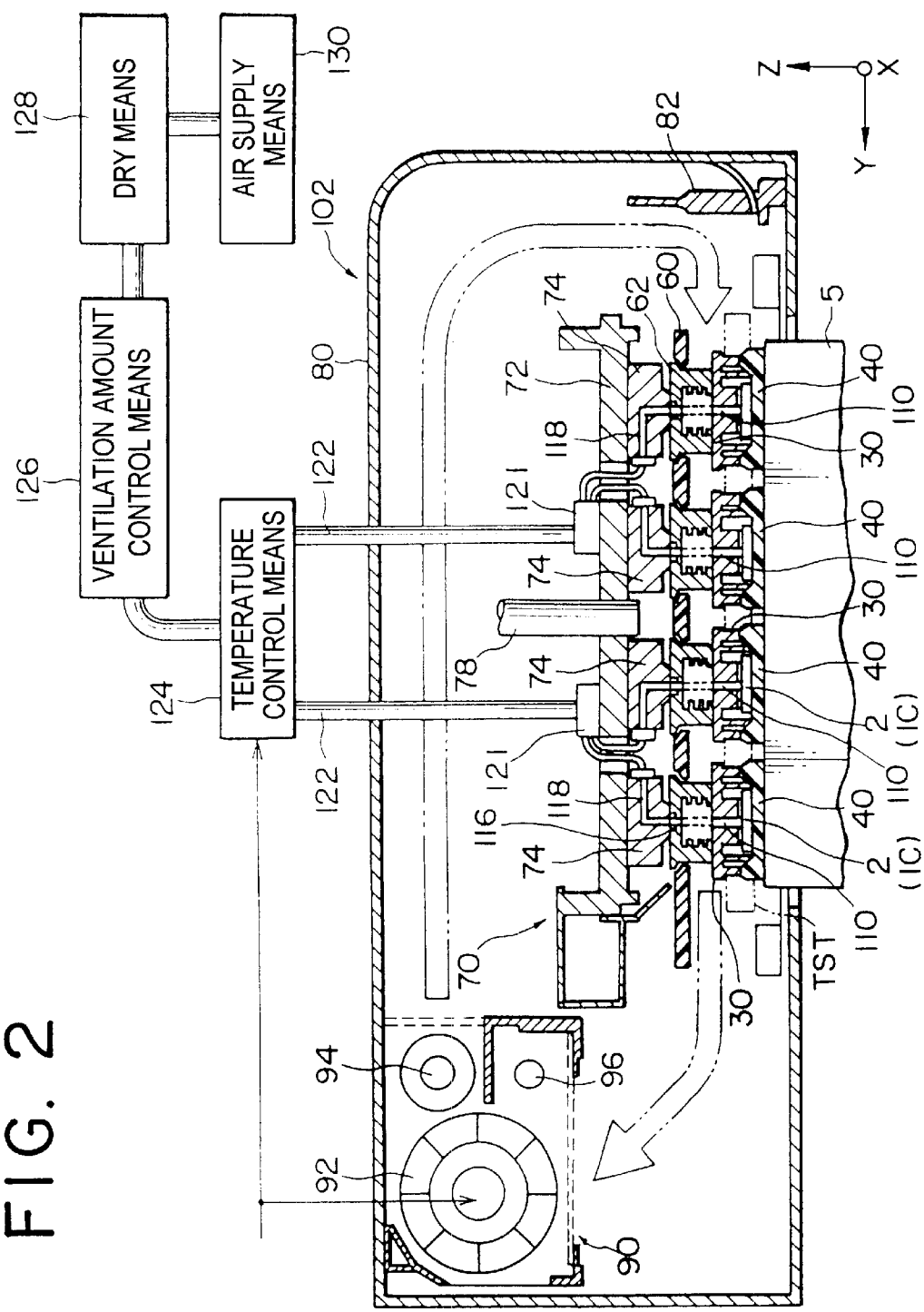
FIG. 2 is a sectional view of the configuration inside a test chamber of the electric device testing apparatus of FIG. 1.
Figure 3:
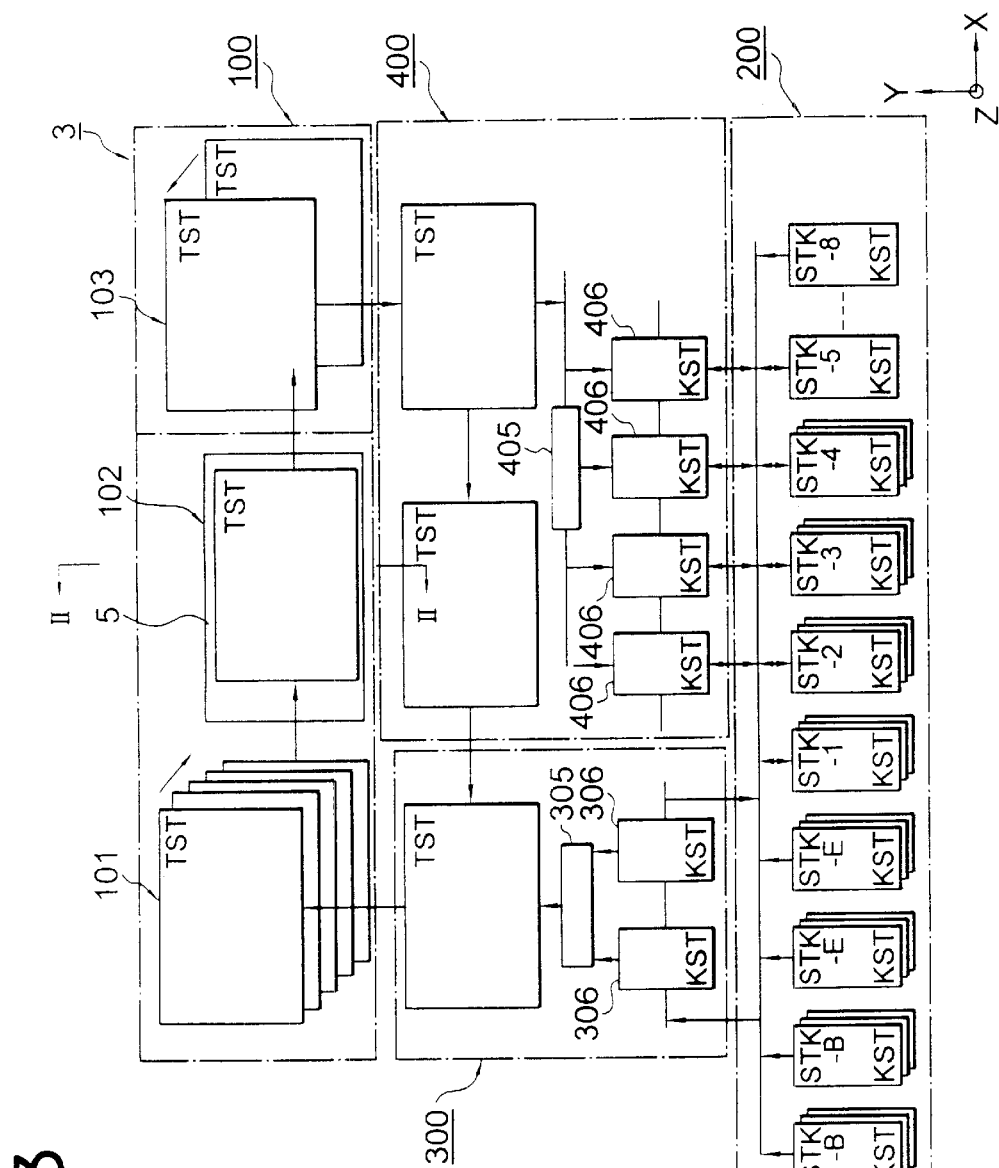
FIG. 3 is a flow chart of a tray showing a handling method of an IC to be tested in the electric device testing apparatus of FIG. 1.

FIG. 1 is a block diagram of a first embodiment of an electric device testing apparatus of the present invention, FIG. 2 is a sectional view of a test chamber according to the same embodiment (a sectional view along the line II—II in FIG. 3), and FIG. 3 is a plan view of a handling method of an IC to be tested used in the same electric device testing apparatus. Note that FIG. 3 is a view for understanding a method of handling an IC to be tested in the electric device testing apparatus of the present embodiment and partially shows by a plane view members actually arranged aligned in the vertical direction.

The electric device testing apparatus 1 of the present embodiment tests (inspects) whether the IC is operating suitably in a state applying a high temperature, a low temperature thermal stress or no thermal stress to the ICs to be tested and classifies the ICs in accordance with the test results, and is configured by, as shown in FIG. 1, a handler 3 for performing operations of conveying ICs to be tested to IC sockets provided on a test head 5 and sorting and storing post-test ICs to predetermined trays in accordance with the test results, a tester 7 for testing the DUTs based on a response signal by sending a test signal, and a test head 5 having an IC socket as an interface between the handler 3 and the tester 7. Note that the tester 7 and the test head 5 are electrically connected via a signal line, such as a cable C1, and the handler 3 and the tester 7 are electrically connected via a signal line, such as a cable C2.

An operation test under such thermal stress is carried out by reloading the ICs to be tested from a tray loaded with a large number of ICs to be tested (hereinafter, referred to as a customer tray KST) to a test tray TST conveyed inside the handler 3. The configuration of any trays KST and TST is not specifically limited, so the detailed illustration will be omitted and is shown schematically in FIG. 3.

A handler 3 of the present embodiment is configured by, as shown in FIG. 3, an IC magazine 200 for storing pre-test ICs and sorting and storing post-test ICs, a loader section 300 for sending to a chamber section 100 the ICs to be tested sent from the IC magazine 200, a chamber section 100 including a test head 5, and an unloader section 400 for sorting and taking out the ICs tested in the chamber section 100.

The IC magazine 200 is provided with a pre-test IC stocker for storing ICs before being tested and a post-test IC stocker for storing ICs sorted in accordance with test results. In an example shown in FIG. 3, two stockers STK-B are provided as the pre-test stocker, two empty stockers STK-E to be sent to the unloader section 400 are provided next to that and eight stockers STK-1, STK-2, . . . , STK-8 are provided further next to that as the post-test IC stocker so that they can hold ICs sorted into a maximum of eight classes according to the test results.

The above customer tray KST is conveyed from the lower side to an opening 306 of the loader section 300 by a tray transfer arm (not shown) provided above the IC magazine 200. Further, in the loader section 300, the ICs to be tested loaded on the customer tray KST are transferred once to a preciser 305 by an X-Y-conveyor (not shown). There, the mutual positions of the ICs to be tested are corrected, then the ICs to be tested transferred to the preciser are reloaded on the test tray TST stopped at the loader section 300 using the X-Y conveyor again.

The above test tray TST is loaded with ICs to be tested at the loader section 300 and sent to the chamber section 100, and the respective ICs to be tested are tested being carried on the test tray TST.

The chamber section 100 is configured by a constant temperature chamber 101 for giving a desired high temperature or low temperature thermal stress to the ICs loaded on the test tray TST, a test chamber 102 for making the ICs contact contact pins of the test head in a state given the thermal stress by the constant temperature chamber 101, and a soak chamber 103 for removing the given thermal stress from the ICs tested in the test chamber 102.

As shown conceptually in FIG. 3, the constant temperature chamber 101 is provided with a vertical conveyer, and a plurality of test trays TST stand by supported by the vertical conveyor until the test chamber 102 becomes empty. While standing by, a high temperature or low temperature thermal stress is applied to the ICs to be tested.

The test chamber 102 has a test head 5 arranged at its center, the test tray TST is conveyed above the test head 5, and a test is carried out by bringing input/output terminals HB of the ICs to be tested to be electrically in contact with the contact pins 51 of the test head 5 (see FIG. 1). On the other hand, the test tray TST finished being tested is treated in the soak chamber 103 to return the temperature of the ICs to a room temperature, then is discharged to the unloader section 400.

Note that the test tray TST discharged from the soak chamber 103 is sent back to the constant temperature chamber 101 via the unloader section 400 and the loader section 300.

The unloader section 400 is provided with an X-Y conveyer having the same configuration with the X-Y conveyer provided to the loader section 300, and post-test ICs are reloaded from the test tray TST conveyed out to the unloader section 400 to the customer tray KST by the X-Y conveyer.

As shown in FIG. 1, the unloader section 400 is formed two pairs of openings 406, 406 arranged so that the customer trays KST carried to the unloader section 400 can be brought close from below. Further, while not illustrated, an elevator table for elevating or lowering a customer tray KST is provided below the respective openings 406. A customer tray KST becoming full after being reloaded with the post-test ICs is placed on here and lowered and the full tray is passed to the tray transfer arm.

Note that in the handler 3 of the present embodiment, while there are a maximum of eight types of sortable categories, it is only possible to arrange a maximum of four customer trays KST at the openings 406 of the unloader section 400. Therefore, a buffer portion 405 is provided between the test tray TST and the openings 406 of the unloader section 400 to temporarily keep ICs to be tested of categories which only rarely arises.

Next, inside structure of the test chamber 102 will be explained with reference to FIG. 2.

A pusher 30 shown in FIG. 2 is provided on the upper side of the test head 5 corresponding to the number of socket guides 40. The respective pushers 30 are fixed to the lower end of an adopter 62 elastically held by a match plate 60.

The match plate 60 is mounted so that it positions above the test head 5 and that the test plate TST can be inserted between the pusher 30 and the socket guide 40. The match plate 60 is mounted movably with respect to a drive plate 72 of the test head 5 or to a Z-axial drive 70, and has the structure of being able to be changed together with the adapter 62 and the pusher 30 in accordance with a shape, etc. of the ICs to be tested 2.

Note that the test plate TST is conveyed from the vertical direction (X-axis) with respect to the paper surface in FIG. 1 to between the pusher 30 and the socket guide 40. As a test plate TST conveying means inside the chamber 100, a convey roller, etc. is used. At the time of conveying and moving the test tray TST, the drive plate of the Z-axial drive 70 rises along the Z-axis and a sufficient space for the test tray TST to be inserted is provided between the pusher 30 and the socket guide 40.

On the lower surface of the drive plate 72 provided inside the test chamber 102 is fixed push portions 74 for the number corresponding to the number of the adapters 62, so that the upper surface of the adapters 62 held by the match plate 60 is able to be removably pushed. A drive axis 78 is fixed to the drive plate 72 and is connected to a not shown common pressure cylinder. The common pressure cylinder is configured by, for example, an air pressure cylinder, which makes the drive axis 78 move up and down along the Z-axis and is able to push the upper surface of the adapter 62. Note that the pushing portion 74 is configured by a separately (individually) push pressure cylinder and a push rod, etc., and the separately push pressure cylinder may be driven to lower the push rod to separately push the upper surface of the respective adapters after the drive plate 72 comes close to the match plate 60.

At the center of the pusher 30 fixed to the lower end of each of the adapter 62 is formed a rod 31 for pushing the IC to be tested 2 as shown in FIG. 1. Also, at the lower side of the socket guide 40 is fixed a socket 50 having a plurality of contact pins (contact portions) 51, which are biased in the upward direction by not shown springs. Therefore, although an IC to be tested 2 is pushed, the contact pins 51 will retract to the top surface of the socket 50. On the other hand, it is possible for the contact pins 51 to contact all of the terminals of the ICs to be tested 2 even if the ICs to be tested 2 are pushed somewhat at an angle.

In the present embodiment, as shown in FIG. 1, in the test chamber 102 configured as above, inside the sealed casing 80 composing the test chamber 102 is mounted a temperature adjusting ventilator 90. The temperature adjusting ventilator 90 comprises a fan 92, a heater 94 and a nozzle 96 for emitting a jet of liquid nitrogen and rises inside the casing 80 at a predetermined temperature condition (for example from a room temperature to 160° C.) by blowing the air inside the casing by the fan 92 and blowing out inside the casing 80 via the heater 94. Also, it lowers inside the casing 80 at a predetermined temperature condition (for example from −60° C. to a room temperature) by emitting a jet of the liquid nitrogen inside the casing by the nozzle 96 and blowing out inside the casing 80 by the fan 92.

Note that the warm or cold wind generated through the temperature adjusting ventilator 90 flows along Y-axial direction above the casing 80 and falls along the side wall of the casing which is an opposite side of the apparatus 90, and returns to the apparatus 90 through the space between the match plate 60 and the test head 5 to circulate inside the casing.

In the present embodiment, in a handler 3 having a test chamber 102 provided with the temperature adjusting ventilator 90, a first ventilation hole 110 is formed along the center of the axis on the rod 31 of the respective pushers 30. The lower-end opening of the first ventilation hole 110 is formed at the approximate center of the lower-end surface of the rod 31. On the lower-end surface 31*a* of the rod 31 is formed a plurality of radius grooves extending in the radius direction as the lower-end opening of the first ventilation hole 110 being its center. These radius grooves are connected to the first ventilation hole 110 and have a function to prevent the lower-end opening of the first ventilation hole 110 from completely sealed even when the lower-end surface of the rod 31 contacts the IC to be tested 2.

The upper-end opening of the first ventilation hole 110 is opened facing the upper surface of the pusher 30 and is connected to inside a second ventilation hole 116 via an inner space portion inside the adapter 62. Note that in a case of an adapter 62 without the inner space portion, the second ventilation hole 116 extends in the axial direction, and the second ventilation hole 116 and the first ventilation hole 110 are directly connected when fitting the upper surface of the pusher 30 with the lower surface of the adaptor 62.

The upper-end opening of the second ventilation hole 116 formed on the adopter 62 is tightly connected to the lower-end opening of a third ventilation hole 118 formed on the pushing portion 74 via a sealing member, such as an O-ring. As shown in FIG. 2, the third ventilation hole 118 formed on the respective pushing portion 74 is connected to the air distributer 121 via a ventilation tube. The air distributer 121 distributes a temperature adjusted air (temperature adjusted gas) supplied from the temperature control means 124 arranged outside the test chamber 102 via the ventilation tube to the first ventilation hole 110 on the respective pushers 30.

The air distributer 121 may comprise, for example, a flowing amount control valve for separately controlling the ventilation amount to ventilate the temperature adjusted air to the respective ICs to be tested 2 via the respective ventilation holes 110. Also, the air distributer 121 may be provided therein with a cooling element or a heater, and the temperature of the temperature adjusted air blown to the ICs to be tested 2 from the first ventilation hole 110 of the respective pushers 30 can be adjusted individually for every IC to be tested 2.

The temperature control means 124 is connected to an overall ventilation amount control means 126, a dry means 128 and an air supply means 130 in the order.

The air supply means 130 comprises a ventilation apparatus, such as a fan and a compressor, and ventilates an air outside the test chamber 102 to the dry means 128. The dry means 128 is a typical apparatus and for generating a dry air for drying the air supplied from the air supply means 130. The ventilation control means 126 is an apparatus for controlling the overall ventilation amount blown from the first ventilation hole 110 on the pusher 30 positioned inside the test chamber 102, and composed of an electrically controlled flowing amount control valve, etc. The temperature control means 124 is an apparatus for controlling the temperature of the temperature adjusted air as a whole blown to the IC to be tested 2 from the first ventilation hole 110 of the pusher 30.

The temperature adjusted air treated in the above way is blown around the IC to be tested 2 via the ventilation tube 122, the air distributer 121, the ventilation holes 118, 116 and 110, and radius grooves.

Especially, an electric device testing apparatus 1 of the present embodiment utilizes a temperature sensing element 2D installed inside an IC to be tested 2 to detect an actual temperature of the IC to be tested 2 during a test.

As is shown in the block diagram in FIG. 1, since an element such as a diode is a temperature sensing element 2D by which signal characteristics on a temperature is defined to be one meanings, it also reads an output signal from an input/output terminal HB (including a ground terminal) electrically connected to the temperature sensing element 2D at the time of reading a response signal by a tester 7, and thereby calculates the actual temperature of the IC to be tested.

Therefore, an electric signal of the input/output terminal HB corresponding to the temperature sensing element 2D is taken from the contact pin 51 of the test head 5 to a temperature calculation means 501 provided inside the tester 7 via a cable C1. The temperature calculation means 501 stores a calculation program for calculating an actual temperature from diode characteristics of the temperature sensing element 2D of the IC to be tested 2, and the thus obtained actual temperature of the IC to be tested is sent to an applying temperature control means 502 of the handler 3 via a cable C2 (for example, GP-IB base or RS232C base).

Taking in of the electric signal regarding the temperature sensing element 2D from the test head 5 to the tester 7 can be attained by adding to a test program set to the tester 7 commands for taking in the electric signal of the temperature sensing element 2D, thus, changing of the hardware, etc. is not necessary. Further, sending of temperature data from the tester 7 to the handler 3 can be also changed on software by inserting the operation during the normally carried out communication between the tester 7 and the handler 3, thus it can be also attained without changing the hardware.

Since the temperature data input to the applying temperature control means 502 is the temperature of the IC to be tested itself, whether or not the value is within a temperature range of test conditions is judged and when it is out of the temperature conditions, an instruction signal so as to make it within the temperature conditions is sent to the temperature applying means 503.

Note that the temperature applying means 503 shown in FIG. 1 corresponds to the temperature adjusting means in FIG. 2 comprising the temperature adjusting ventilator 90, the air supply means 130, the dry means 128, the ventilation amount control means 126 and the temperature control means 124. Note that the configuration of the temperature applying means is not specifically limited and it may be only a temperature adjusting ventilator 90 or only the temperature adjusting apparatus. Also, it may be a temperature applying apparatus of another configuration. To summarize, the present invention has as its main object to directly detect a temperature of an IC to be tested by using a temperature sensing element 2D installed inside the IC to be tested, thus configurations other than that are not specifically limited.

Operations will be explained next.

In the test chamber 102 in the chamber section 100, an IC to be tested is conveyed above the test head 5 in a state being carried on a test tray TST.

When the test tray TST stops at the test head 5, the Z-axis drive 70 starts to descend, the IC to be tested 2 is pressed against contact pins 51 by rods 31, then a test starts.

The IC to be tested 2 may generate heat by itself due to a variety of test signals sent from the tester 7 in some cases. In the present embodiment, however, an electric signal from the temperature sensing element 2D of the IC to be tested 2 is taken to the temperature calculation means 501 of the tester 7, and the actual temperature of the IC to be tested 2 is calculated by the taken electric signal and characteristics of the temperature sensing element 2D. The obtained temperature is sent to the applying temperature control means 502 of the handler 3, the temperature applying means 503 is thereby controlled, and the IC to be tested 2 is kept to be an appropriate temperature.

Second Embodiment

Figure 4:
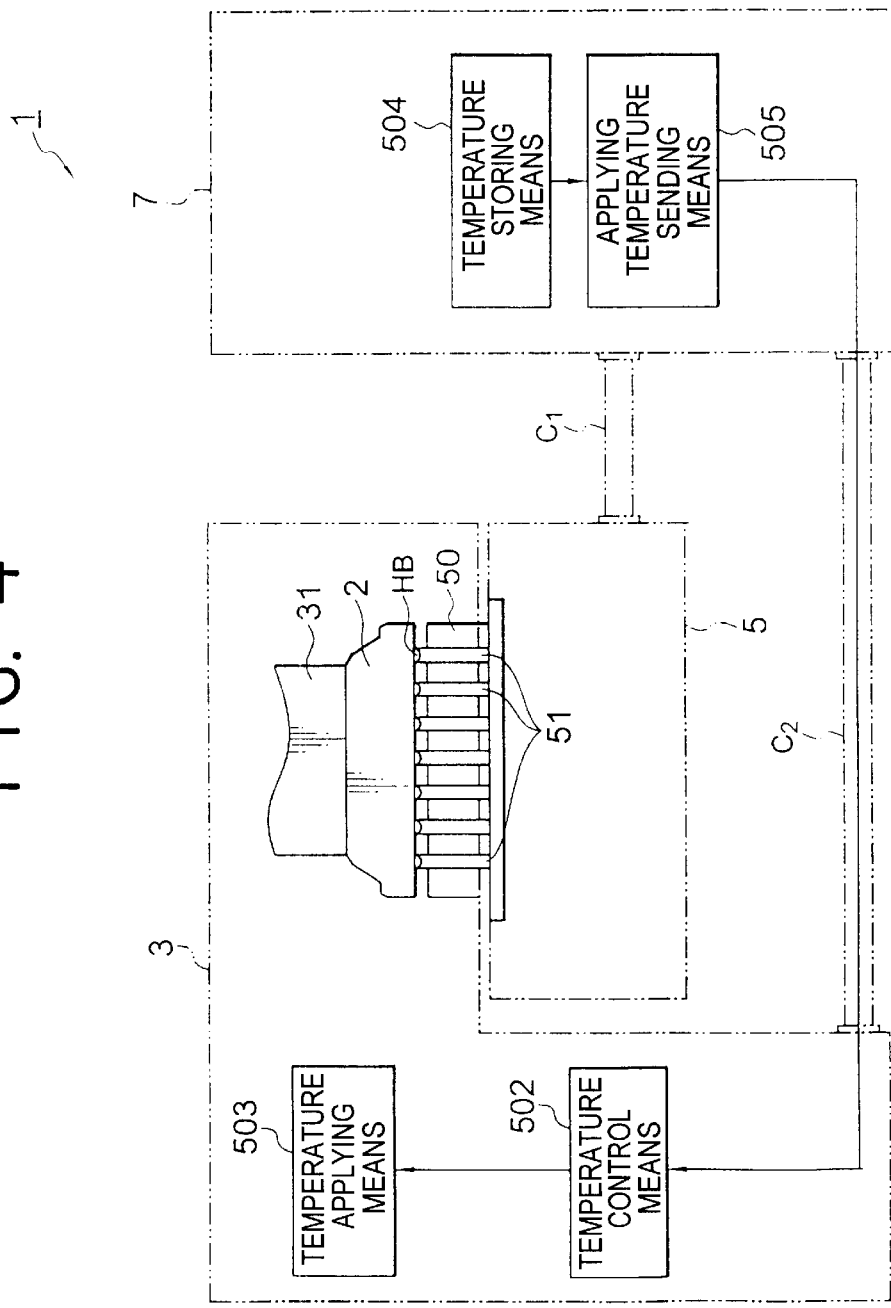
FIG. 4 is a block diagram of a second embodiment of the electric device testing apparatus of the present invention.

The present invention is not limited to the above embodiments, and a variety of modifications can be made. FIG. 4 is a block diagram of another embodiment of the present invention.

In the present example, instead of using the temperature sensing element 2D installed as a temperature sensor in the IC to be tested 2, a temperature storing means 504 is provided to the tester 7.

The temperature storing means 504 measures in advance an actual temperature of the IC to be tested when it is carried out a test under desired test conditions. Then, at the time of sending a test signal from the tester 7 to the test head 5, a temperature control value in accordance with a corresponding test step is added to an operational communication program sent from the tester 7 to the handler 3. The program having the temperature control value itself corresponds to the temperature storing means 504 and the applying temperature transfer means 505.

By measuring the temperature of an IC to be tested to be obtained in advance by using the temperature sensing element 2D of the IC to be tested in the same way as in the above first embodiment, the actual temperature of the IC to be tested can be correctly detected in the same way as in the first embodiment, and the reliability of test results improve.

Also, in the present invention, since so called feed-forward control is possible, if a desired temperature is sent in advance prior to conveyance of an IC to be tested, time to reach the desired temperature after the conveyance of the IC to be tested can be made shorter.

Note that the embodiments explained above were described to facilitate the understanding of the present invention and not to limit the present invention. Accordingly, elements disclosed in the above embodiments include all design modifications and equivalents belonging to the technical field of the present invention.

What is claimed is:

1. An electric device testing apparatus for carrying out a test by pushing a terminal of an electric device to be tested against a contact portion of a test head, comprising:

an applying temperature control means for controlling an applying temperature to the electric device to be tested;

a temperature storing means for storing data related to an actual temperature of the electric device to be tested under a test conditions obtained in advance on an experimental basis; and an applying temperature sending means for sending data relating to the actual temperature of the electric device to be tested stored in the temperature storing means to the applying temperature control means at the time of sending a test signal;

wherein the applying temperature control means controls an applying temperature to the electric device to be tested based on the data relating to the actual temperature of the electric device to be tested sent from the applying temperature sending means.

2. The electric device testing apparatus as set forth in claim 1, wherein the temperature storing means and the applying temperature sending means are provided to a tester for carrying out the test on the electric device to be tested by sending the test signal to the contact portion.

3. The electric device testing apparatus as set forth in claim 2, wherein the data relating to the actual temperature sent from the applying temperature sending means to the applying temperature control means are included in an operation instruction program to a handler for handling the electric device to be tested from the tester.

* * * * *